US012765139B2

(12) United States Patent
Chang et al.

(10) Patent No.: US 12,765,139 B2
(45) Date of Patent: Oct. 13, 2026

(54) DISPLAY DEVICE

(71) Applicant: AUO Corporation, Hsin-Chu (TW)

(72) Inventors: Wan-Heng Chang, Hsin-Chu (TW); Wei-Ming Cheng, Hsin-Chu (TW); Sung-Yu Su, Hsin-Chu (TW)

(73) Assignee: AUO Corporation, Hsin-Chu (TW)

( * ) Notice: Subject to any disclaimer, the term of this patent is extended or adjusted under 35 U.S.C. 154(b) by 460 days.

(21) Appl. No.: 18/539,325

(22) Filed: Dec. 14, 2023

(65) Prior Publication Data

US 2025/0081690 A1 Mar. 6, 2025

(30) Foreign Application Priority Data

Sep. 1, 2023 (TW) ................................ 112133354

(51) Int. Cl.

| | |
|---|---|
| ***H01L 33/58*** | (2010.01) |
| ***H01L 25/075*** | (2006.01) |
| ***H10H 20/855*** | (2025.01) |
| ***H10H 29/14*** | (2025.01) |
| ***H10H 29/855*** | (2025.01) |
| ***H10W 90/00*** | (2026.01) |
| *H10H 29/30* | (2025.01) |

(52) U.S. Cl.

CPC ........ *H10H 20/855* (2025.01); *H10H 29/142* (2025.01); *H10H 29/8552* (2025.01); *H10W 90/00* (2026.01); *H10H 29/30* (2025.01)

(58) Field of Classification Search

CPC ............... H10H 29/142; H10H 29/855; H10H 29/8552; H10H 20/84; H10H 20/85; H10H 20/855; H10K 2102/3023-3035; H10K 59/353

See application file for complete search history.

(56) References Cited

U.S. PATENT DOCUMENTS

| | | | | |
|---|---|---|---|---|
| 2004/0038138 | A1* | 2/2004 | Kiguchi | G03F 7/0007 430/323 |
| 2016/0274412 | A1 | 9/2016 | Gu | |
| 2017/0117257 | A1* | 4/2017 | Lee | H10W 90/00 |
| 2020/0027918 | A1* | 1/2020 | Chen | H10H 20/857 |
| 2020/0365674 | A1* | 11/2020 | Jeon | H10D 86/411 |
| 2022/0057335 | A1 | 2/2022 | Atkinson et al. | |
| 2022/0067323 | A1* | 3/2022 | Chen | G06V 40/1306 |

* cited by examiner

*Primary Examiner* — Victoria K. Hall
(74) *Attorney, Agent, or Firm* — WPAT, PC

(57) ABSTRACT

A display device includes a pixel array substrate, light emitting elements, a lower plate and a black pattern layer. The pixel array substrate has a display surface and a bottom surface opposite to the display surface. The display surface has pixel regions and light transmitting regions arranged alternately. The light emitting elements are disposed on the display surface and electrically connected to the pixel array substrate, where the light emitting elements are located in the pixel regions. The bottom surface is located between the display surface and the lower plate. The black pattern layer is disposed between the pixel array substrate and the lower plate, and has light shielding parts and first opening areas arranged alternately. The light shielding parts overlap with the pixel regions, and the first opening areas overlap with the light transmitting regions.

15 Claims, 13 Drawing Sheets

DISPLAY DEVICE

CROSS-REFERENCE TO RELATED APPLICATION

This application claims priority to Taiwan Application Serial Number 112133354, filed Sep. 1, 2023, which is herein incorporated by reference in its entirety.

BACKGROUND

Field of Invention

The present disclosure relates to a display device. More particularly, the present disclosure relates to a display device including a black pattern layer disposed between the pixel array substrate and the lower plate.

Description of Related Art

Most of the existing display devices are opaque, and such opaque display devices are limited in some applications. For example, in terms of automotive displays, opaque display devices will block the driver's sight, so opaque display devices are not suitable to install directly on the windshield as a head-up display (HUD). In the same way, opaque display devices are not suitable to install directly on the visor of a helmet or glasses, making them unsuitable for some wearable devices. However, since the transparent display device is provided with light transmitting regions, light may leak from the bottom surface opposite to the display surface, resulting in shortcomings such as ghosting and insufficient privacy.

SUMMARY

At least one embodiment of the present disclosure provides a display device including a black pattern layer disposed between the pixel array substrate and the lower plate, which can help to reduce back light leakage.

The display device according to at least one embodiment of the present disclosure includes a pixel array substrate, light emitting elements, a lower plate and a black pattern layer. The pixel array substrate has a display surface and a bottom surface opposite to the display surface. The display surface has pixel regions and light transmitting regions, and the pixel regions are arranged alternately with the light transmitting regions in a first direction. The light emitting elements are disposed on the display surface and electrically connected to the pixel array substrate, where the light emitting elements are located in the pixel regions. The bottom surface is located between the display surface and the lower plate. The black pattern layer is disposed between the pixel array substrate and the lower plate in a second direction perpendicular to the first direction and has light shielding parts and first opening areas, where the light shielding parts are arranged alternately with the first opening areas in the first direction. The light shielding parts overlap with the pixel regions, and the first opening areas overlap with the light transmitting regions in the second direction.

The display device according to at least another embodiment of the present disclosure includes a pixel array substrate, light emitting elements, a lower plate, a black pattern layer, a cover plate and a transparent medium pattern layer. The pixel array substrate has a display surface and a bottom surface opposite to the display surface. The display surface has pixel regions and light transmitting regions, and the pixel regions are arranged alternately with the light transmitting regions in a first direction. The light emitting elements are disposed on the display surface and electrically connected to the pixel array substrate, where the light emitting elements are located in the pixel regions. The bottom surface is located between the display surface and the lower plate. The black pattern layer is disposed between the pixel array substrate and the lower plate in a second direction perpendicular to the first direction and has light shielding parts and first opening areas, where the light shielding parts are arranged alternately with the first opening areas in the first direction. The cover plate is disposed on the light emitting elements. The transparent medium pattern layer is disposed between the cover plate and the light emitting elements. The transparent medium pattern layer has a plurality of medium parts and a plurality of second opening areas, and the medium parts are arranged alternately with the second opening areas in a third direction perpendicular to the second direction, and third direction is different from the first direction.

DETAILED DESCRIPTION

Figure 1:
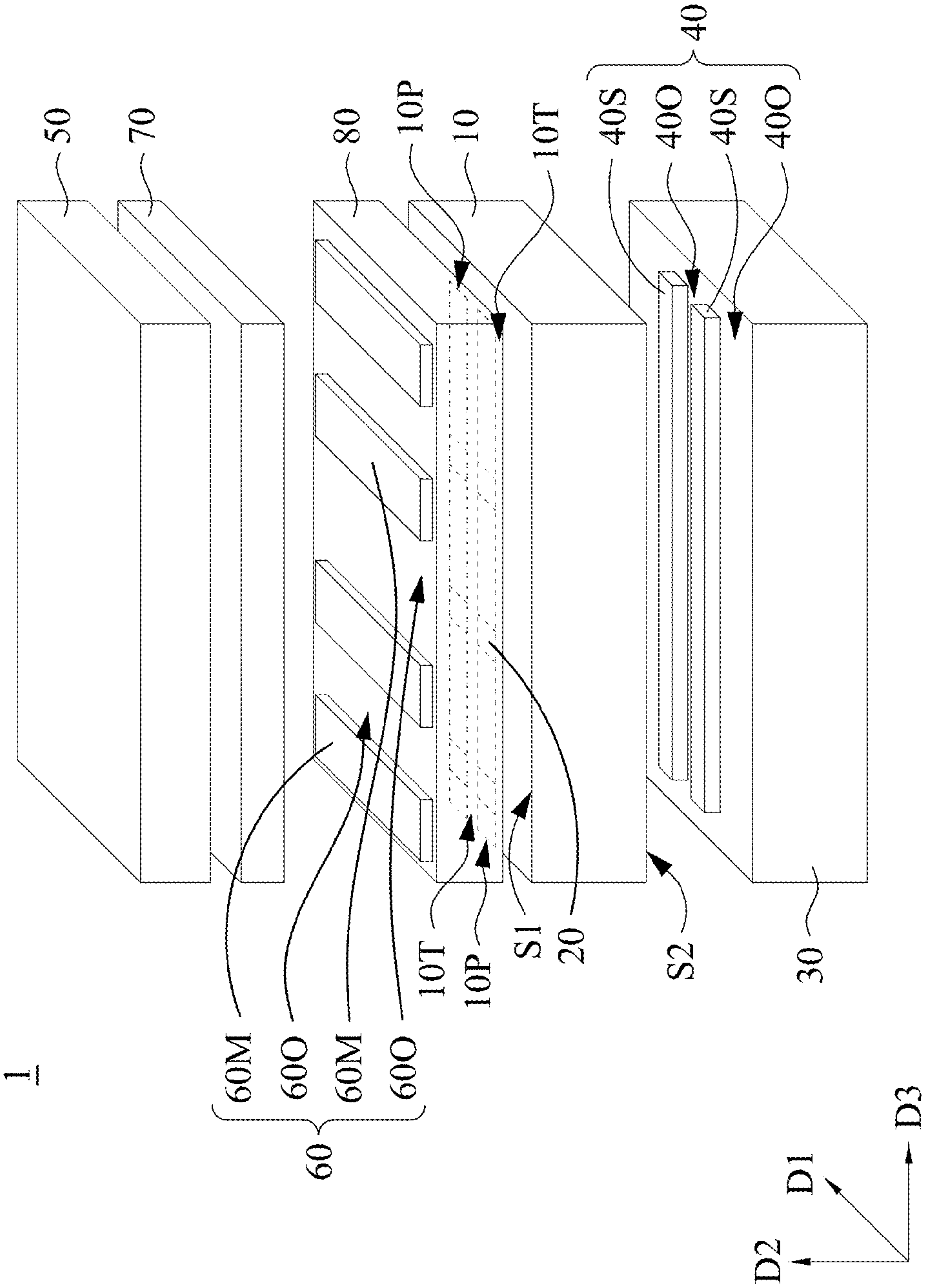
FIG. 1 is a schematic view of a display device according to at least one embodiment of the present disclosure.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words “about”, “approximately” or “substantially” used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are “substantially parallel” or “substantially perpendicular,” where “substantially parallel” and “substantially perpendicular,” respectively, mean that parallelism and perpendicularity between the two objects can include non-parallelism and non-perpendicularity caused by permissible deviation ranges.

In addition, “about” may mean within one or more standard deviations of the above values, such as within ±30%, ±20%, ±10%, or ±5%. Such words as “about”, “approximately”, or “substantially” as appearing in the present disclosure may be used to select an acceptable range of deviation or standard deviation according to optical properties, etching properties, mechanical properties, or other properties, rather than applying all of the above optical properties, etching properties, mechanical properties, and other properties with a single standard deviation.

The spatial relative terms used in the present disclosure, such as “below,” “under,” “above,” “on,” and the like, are intended to facilitate the recitation of a relative relationship between one element or feature and another as depicted in the drawings. The true meaning of these spatial relative terms includes other orientations. For example, the relationship between one element and another may change from “below” and “under” to “above” and “on” when the drawing is turned 180 degrees up or down. In addition, spatially relative descriptions used in the present disclosure should be interpreted in the same manner.

It should be understood that while the present disclosure may use terms such as “first”, “second”, “third” to describe various elements or features, these elements or features should not be limited by these terms. These terms are primarily used to distinguish one element from another, or one feature from another. In addition, the term “or” as used in the present disclosure may include, as appropriate, any one or a combination of the listed items in association.

Moreover, the present disclosure may be implemented or applied in various other specific embodiments, and the details of the present disclosure may be combined, modified, and altered in various embodiments based on different viewpoints and applications, without departing from the idea of the present disclosure.

FIG. 1 is a schematic view of a display device 1 according to at least one embodiment of the present disclosure. Referring to FIG. 1, the display device 1 includes a pixel array substrate 10, light emitting elements 20, a lower plate 30 and a black pattern layer 40. The pixel array substrate 10 has a display surface S1 and a bottom surface S2 opposite to the display surface S1. The display surface S1 has pixel regions 10P and light transmitting regions 10T. The pixel regions 10P and the light transmitting regions 10T are arranged alternately in a first direction D1. The light emitting elements 20 are disposed on the display surface S1 and electrically connected to the pixel array substrate 10, and the light emitting elements 20 are located in the pixel regions 10P. The bottom surface S2 is located between the display surface S1 and the lower plate 30.

The black pattern layer 40 is disposed between the pixel array substrate 10 and the lower plate 30 in a second direction D2 perpendicular to the first direction D1, and has light shielding parts 40S and first opening areas 40O. The light shielding parts 40S and the first opening areas 40O are arranged alternately in the first direction D1. In the second direction D2, the light shielding parts 40S overlap the pixel regions 10P, and the first opening areas 40O overlap the light transmitting regions 10T. By disposing the black pattern layer 40 between the pixel array substrate 10 and the lower plate 30 as described above, the light leakage from the bottom surface S2 which emitted from the light emitting elements 20 after total reflected and passed through the light transmitting regions 10T can be shielded, so as to mitigate light leakage from the back side of the display device 1.

As shown in FIG. 1, the display device 1 further includes a cover plate 50 and a transparent medium pattern layer 60. The cover plate 50 is disposed on the light emitting elements 20, that is, the display surface S1 is located between the cover plate 50 and the bottom surface S2. The transparent medium pattern layer 60 is disposed between the cover plate 50 and the light emitting elements 20 in the second direction D2, that is, the transparent medium pattern layer 60 is disposed between the cover plate 50 and the display surface S1. The refractive index of the transparent medium pattern layer 60 is greater than the refractive index of the cover plate 50, and the transparent medium pattern layer 60 has medium parts 60M and second opening areas 60O. The medium parts 60M and the second opening areas 60O are arranged alternately in the third direction D3 perpendicular to the second direction D2, where the third direction D3 is different from the first direction D1. In the second direction D2, the second opening areas 60O overlap with the light emitting elements 20.

By disposing the transparent medium pattern layer 60 between the cover plate 50 and the display surface S1 as described above, and the refractive index of the transparent medium pattern layer 60 is greater than the refractive index of the cover plate 50, the light emitted by the light emitting elements 20 can form a light path with a smaller refractive angle after it passes through the transparent medium pattern layer 60, which in turn reduces light leakage due to total reflection caused by the cover plate 50, so as to mitigate light leakage from the back side of the display device 1.

Referring to FIG. 1, the display device 1 further includes a connection layer disposed in the second opening areas 60O, where the refractive index of the connection layer is the refractive index of the cover plate 50±5%. In some embodiments, the refractive index of the cover plate 50 is between 1.4 and 1.7 (including end values). In some embodiments, the refractive index of the connection layer is between 1.45 and 1.5 (including end values). The connection layer includes a first connection layer 70 and a second connection layer 80, the first connection layer 70 is disposed between the transparent medium pattern layer 60 and the cover plate 50, and the second connection layer 80 is disposed between the transparent medium pattern layer 60 and the pixel array substrate 10.

Figure 2A:
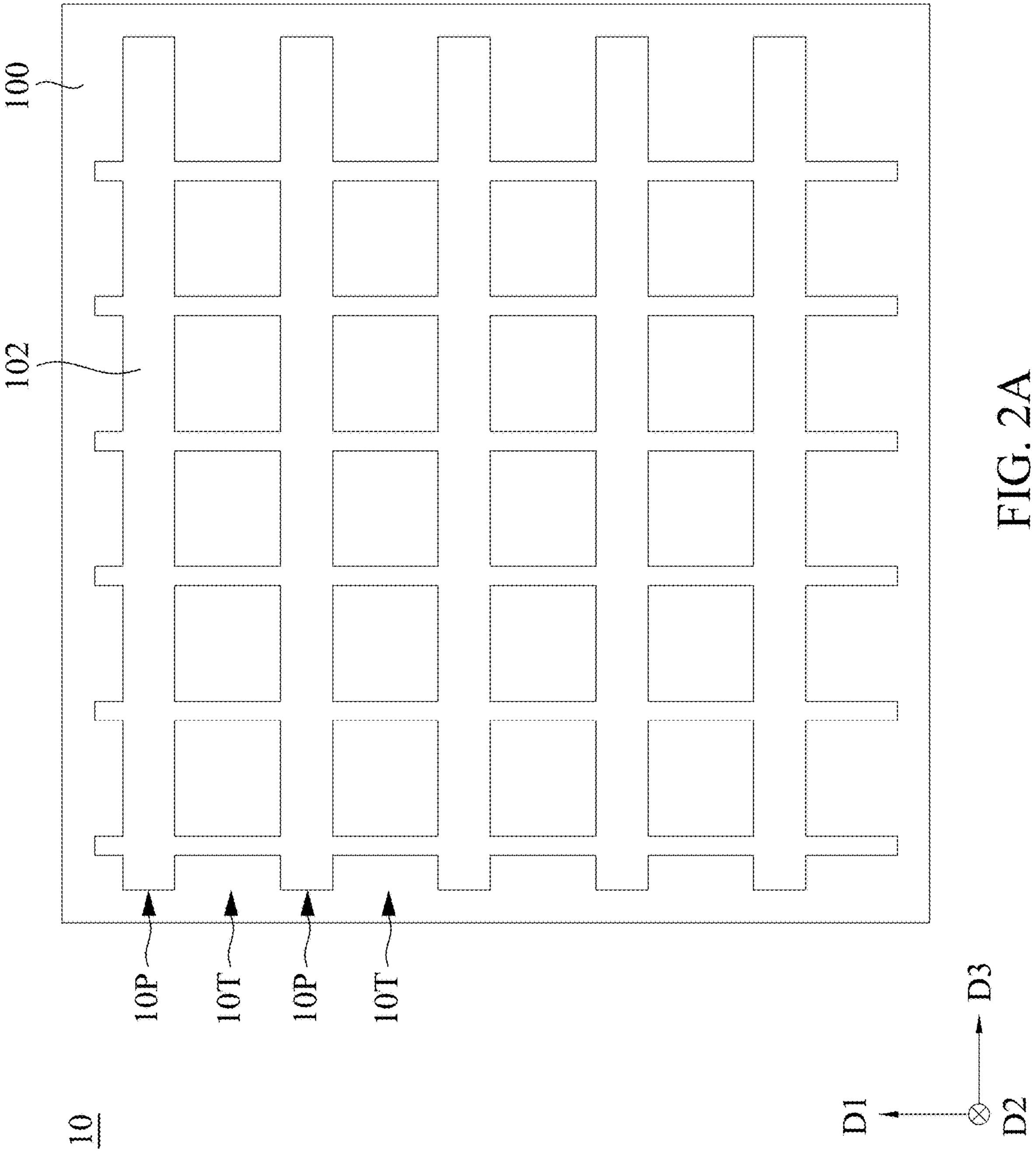
FIG. 2A is a schematic bottom view of a pixel array substrate according to at least one embodiment of the present disclosure.
Figure 2B:
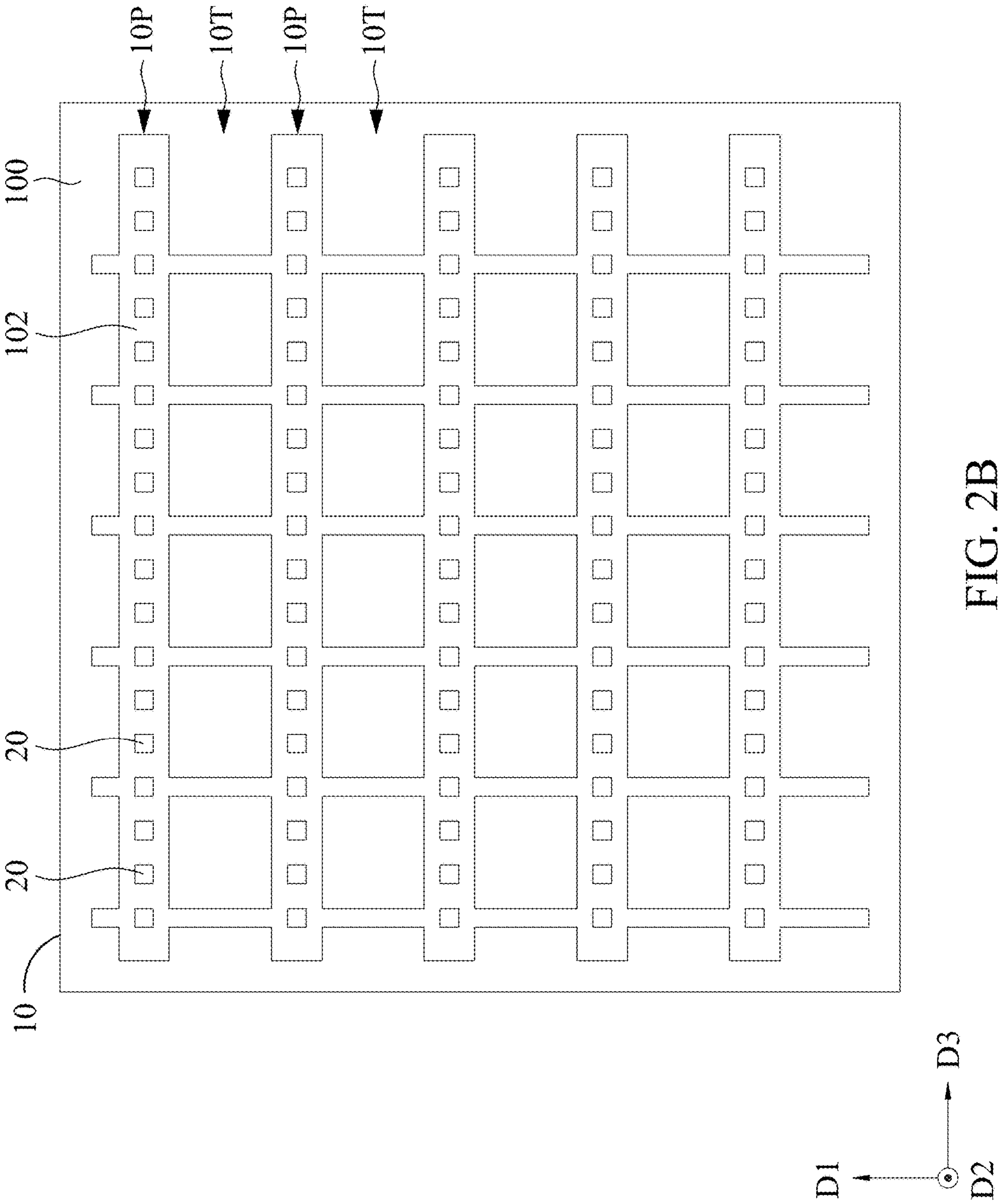
FIG. 2B is a schematic top view of a pixel array substrate and light emitting elements according to at least one embodiment of the present disclosure.

FIG. 2A is a schematic bottom view of a pixel array substrate according to at least one embodiment of the present disclosure. FIG. 2B is a schematic top view of a pixel array substrate and light emitting elements according to at least one embodiment of the present disclosure. Referring to FIGS. 2A and 2B, the pixel array substrate 10 includes a substrate 100 and a driving circuit layer 102 disposed on the substrate 100. The pixel array substrate 10 has pixel regions 10P extending in the third direction D3 and light transmitting regions 10T extending in the direction D3, and the pixel regions 10P and the light transmitting regions 10T are arranged alternately in the first direction D1, so that the display device 1 can be used as a transparent display device. In some embodiments, when the resolution of the display device 1 is greater than 80PPI, the ratio of the total area of the driving circuit layer 102 of the display device 1 to the area of the substrate 100 is not greater than 50%. In some embodiments, when the resolution of the display device 1 is less than 80 PPI, the ratio of the total area of the driving circuit layer 102 of the display device 1 to the area of the substrate 100 is not greater than 80%.

As shown in FIG. 2B, light emitting elements 20 are disposed on the driving circuit layer 102 and electrically connected to the driving circuit layer 102. The light emitting elements 20 are disposed in the pixel regions 10P and arranged at intervals in the third direction D3. The first direction D1 and the third direction D3 are different directions parallel to the pixel array substrate 10, and the second direction D2 is perpendicular to the pixel array substrate 10, that is, perpendicular to the first direction D1 and the third direction D3. In some embodiments, the first direction D1 is perpendicular to the third direction D3.

The light emitting elements 20 may be light emitting diodes (LEDs), such as sub-millimeter light emitting diodes (mini LEDs) or micro light emitting diodes (micro LEDs, μLEDs). The thickness of the micro light emitting diode is below 10 micrometers, for example 6 micrometers. Sub-millimeter light-emitting diodes can be divided into two types: one contains encapsulant and the other does not contain encapsulant. The thickness of sub-millimeter light emitting diode containing encapsulant can be less than 800 micrometers, and the thickness of sub-millimeter light emitting diode without encapsulant can be less than 100 micrometers. In addition, the light emitting elements 20 can also be large-sized regular LEDs other than sub-millimeter light emitting diodes and micro light emitting diodes, so the light emitting elements 20 are not limited to being sub-millimeter light emitting diodes or micro light emitting diodes of smaller size.

The materials of the substrate 100, the lower plate 30, and the cover plate 50 may be quartz, glass, polymer material, and/or other suitable materials. The material of the driving circuit layer 102 may be aluminum, molybdenum, titanium, copper, and/or other suitable materials. The material of the black pattern layer 40 may be black photoresist, black ink and/or other suitable materials. The material of the transparent medium pattern layer 60 may be indium tin oxide (ITO), indium zinc oxide (IZO), aluminum tin oxide (ATO), aluminum zinc oxide (AZO), indium germanium zinc oxide (IGZO) and/or other suitable materials. The materials of the first connection layer 70 and the second connection layer 80 may be optical clear adhesive (OCA), optical clear resin (OCR) and/or other suitable materials.

In some embodiments, the driving circuit layer 102, the black pattern layer 40, and the transparent medium pattern layer 60 may be formed by a deposition process, an inkjet process, a printing process, a coating process, a photolithography process, an etching process, and/or other suitable processes.

Figure 3A:
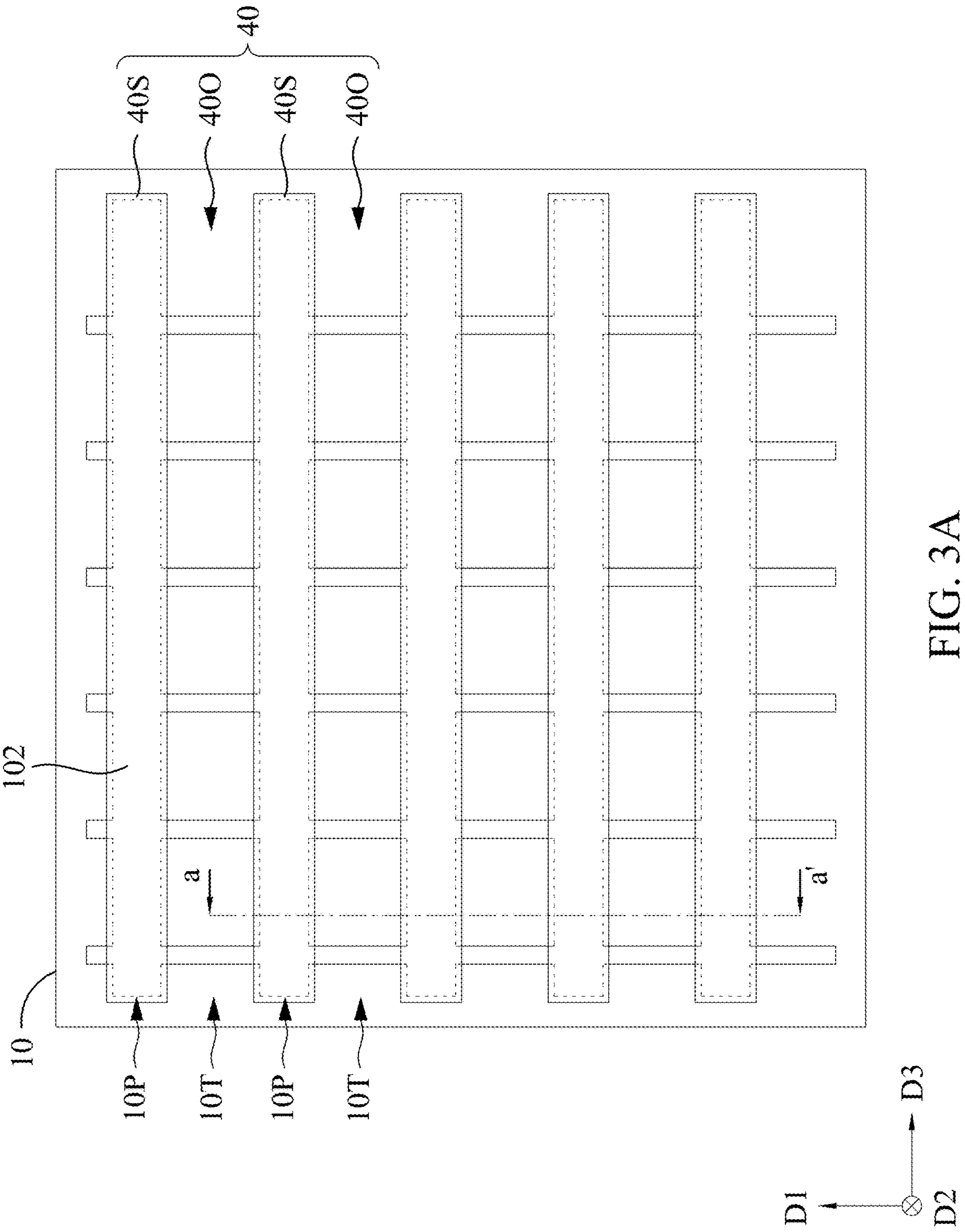
FIG. 3A is a schematic bottom view of a display device according to at least one embodiment of the present disclosure.

FIG. 3A is a schematic bottom view of a display device according to at least one embodiment of the present disclosure. For illustrative purposes, FIG. 3A merely shows the pixel array substrate 10 and the black pattern layer 40. Referring to FIG. 3A, the black pattern layer 40 has light shielding parts 40S extending in the third direction D3 and first opening areas 40O extending in the third direction D3. The light shielding parts 40S and the first opening areas 40O are arranged alternately in the first direction D1, and in the second direction D2, the light shielding parts 40S overlap with the pixel regions 10P, and the first opening areas 40O overlap with the light transmitting regions 10T.

Figure 3B:
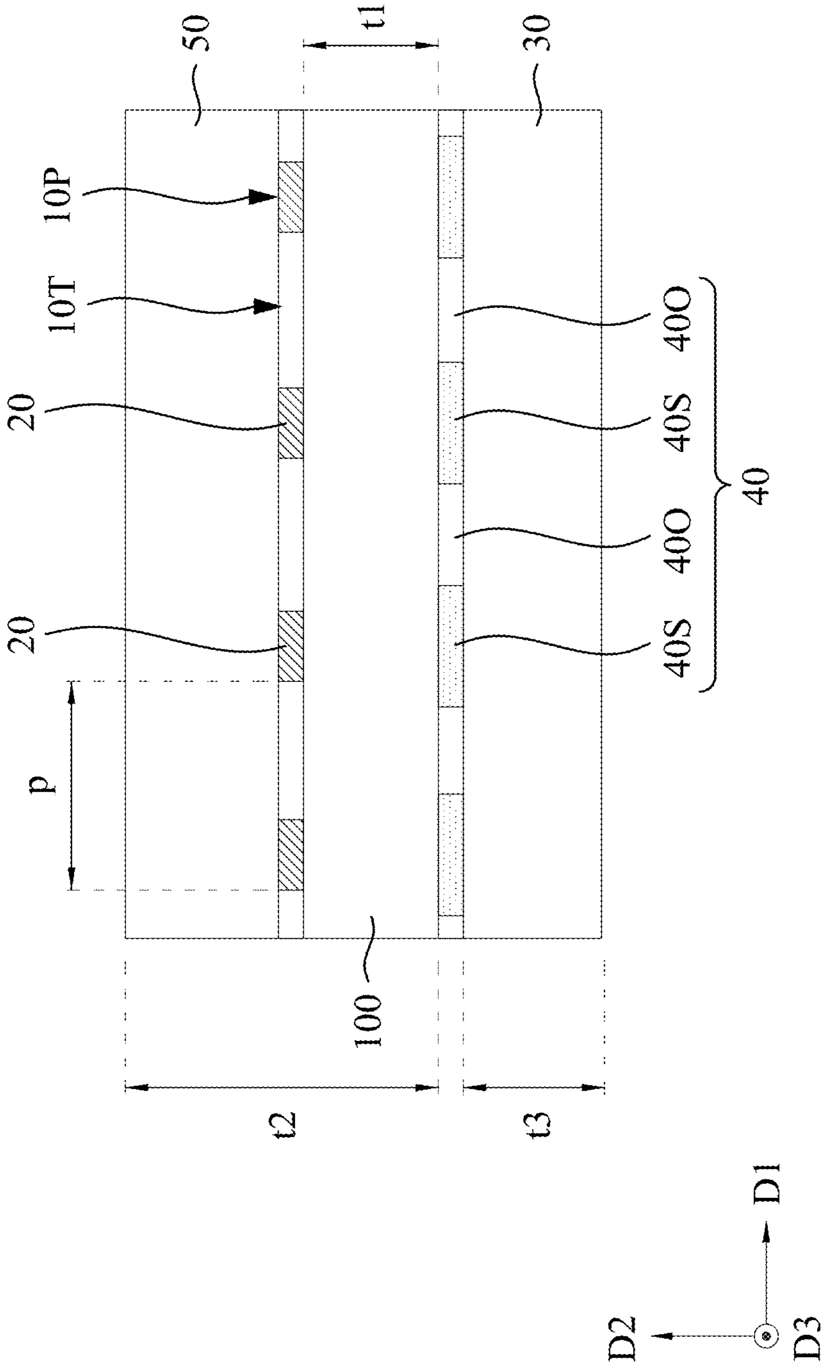
FIG. 3B is a schematic cross-sectional view taken along line a-a' of FIG. 3A.

FIG. 3B is a schematic cross-sectional view taken along line a-a' of FIG. 3A. For illustrative purposes, FIG. 3B merely shows the substrate 100, the light emitting elements 20, the lower plate 30, the black pattern layer 40, and the cover plate 50. Referring to FIG. 3B, the black pattern layer 40, the substrate 100, the light emitting elements 20, and the cover plate 50 are disposed sequentially on the lower plate 30 in the second direction D2. The substrate 100 has a first thickness t1, the total thickness of the cover plate 50 and the substrate 100 is a second thickness t2, and the lower plate 30 has a third thickness t3. It should be noted that since the total thickness of the element layers disposed between the cover plate 50 and the substrate 100 is much smaller than the total thickness of the cover plate 50 and the substrate 100, that is, much smaller than the second thickness t2, so it can be ignored. As shown in FIG. 3B, the arrangement pitch p of the light emitting elements 20 and the first thickness t1 of the substrate 100 satisfy the following mathematical equation (1), which reduces the effect of the black pattern layer 40 on the transmittance of the display device 1 as a transparent display device, where θ is the refraction angle of the light from the air into the substrate 100. In addition, the following mathematical equation (1) can be derived from geometric optics, Snell's Law, and geometric mathematics.

$$t1 \geq \frac{p}{\tan\theta} \pm 10\% \tag{1}$$

In some embodiments, when the equal sign of the mathematical equation (1) holds, the effect of the black pattern layer 40 on the light transmittance of the display device 1 as a transparent display device can be effectively reduced. However, the first thickness t1 of the substrate 100 may be adjusted in accordance with the mathematical equation (1) in the case of different product design requirements.

Since the black pattern layer 40 is designed to shield the light leakage from the bottom surface S2 after the light emitted by the light emitting elements 20 is totally reflected by the cover plate 50 and passes through the light transmitting regions 10T assuming that the total reflection angle of the cover plate 50 is 40 to 45 degrees, the light shielding parts 40S of the black pattern layer 40 should be disposed at an angle of 40 to 45 degrees relative to the surface of the cover plate 50. If the light shielding parts 40S of the black pattern layer 40 are disposed between the light emitting elements 20 and the cover plate 50, in the second direction D2 at the distance from the light emitting elements 20 ranging from the arrangement pitch p to five times the arrangement pitch p, it will block the light transmitting regions 10T to cause the aperture ratio to be zero, or block the light emission of the light emitting element 20 to cause the front display light output to be zero. However, if the light shielding parts 40S of the black pattern layer 40 are disposed between the substrate 100 and the lower plate 30, the light emission of the light emitting elements 20 will not be blocked and the front display light output will not be zero. Only when the light shielding parts 40S of the black pattern layer 40 are disposed between the substrate 100 and the lower plate 30 at the position in the second direction D2 where the distance from the light emitting elements 20 is three times the arrangement pitch p, it will block the light transmitting regions 10T to cause the aperture ratio to be zero, but the light shielding parts 40S of the black pattern layer 40 disposed between the substrate 100 and the lower plate 30 at other positions in the second direction D2 at the distance from the light emitting elements 20 ranging from the arrangement pitch p to five times the arrangement pitch p will not affect the aperture ratio of the light transmitting regions 10T.

Figure 4A:
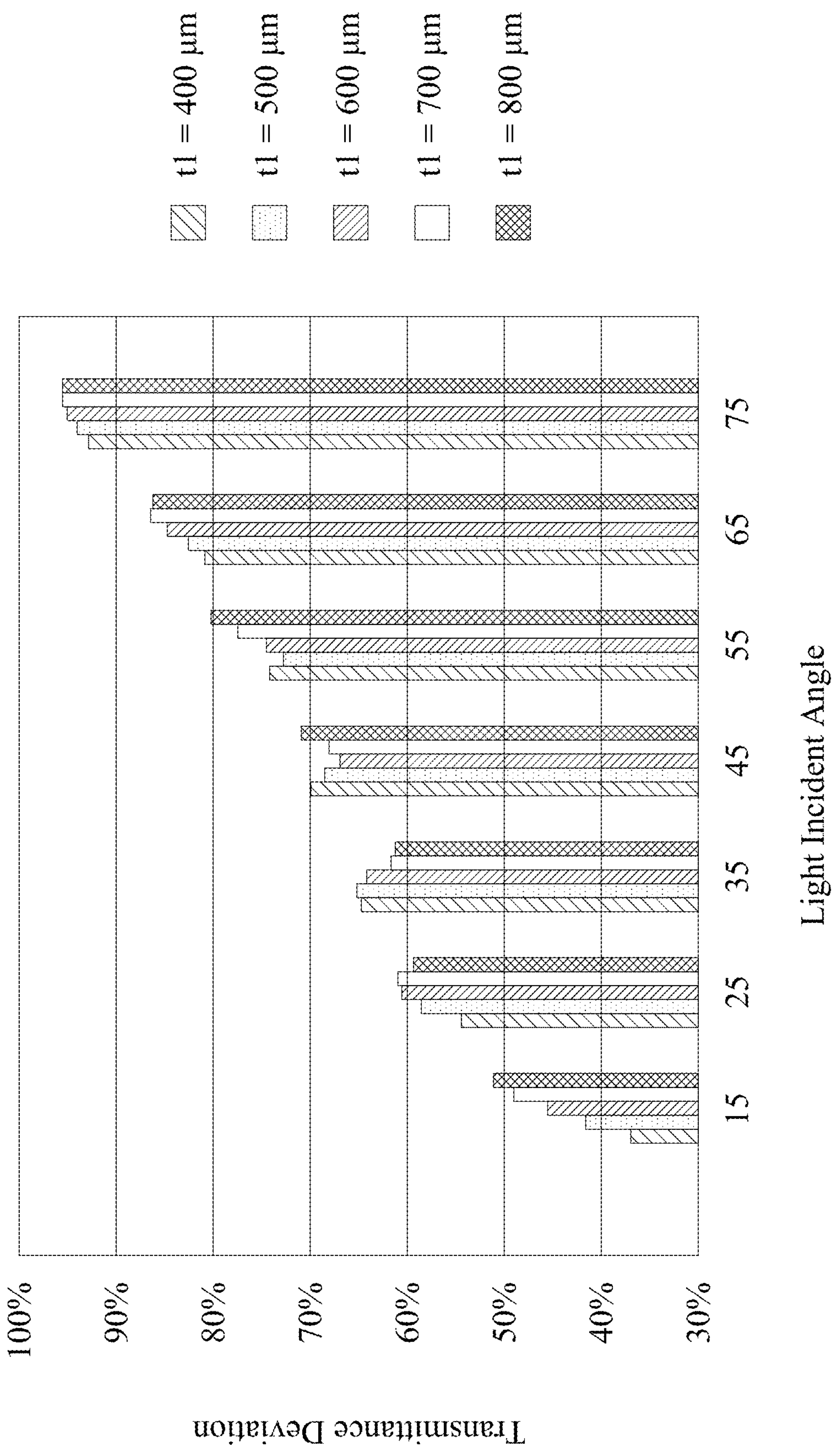
FIG. 4A is a simulated bar diagram of transmittance deviation corresponding to different light incident angles for different substrate thicknesses according to at least one embodiment of the present disclosure.

FIG. 4A is a simulated bar diagram of transmittance deviation corresponding to different light incident angles for different substrate thicknesses according to at least one embodiment of the present disclosure. First, to illustrate how to obtain the data of FIG. 4A, under the structure of FIG. 3B, light incident from the air is set at 0 degrees, 15 degrees, 25 degrees, 35 degrees, 45 degrees, 55 degrees, 65 degrees, and 75 degrees with the normal line of the lower plate 30, and passes through the lower plate 30 and the cover plate 50 of a fixed thickness and the substrate 100 having different first thicknesses t1, where the refractive index of the lower plate 30, the substrate 100, and the cover plate 50 is 1.56, and the arrangement pitch of the light emitting elements 20 is 300 μm. The transmittance of the light incident at each of the aforementioned angles are measured above the cover plate 50 respectively, and the difference between the transmittance of the light incident at 0 degrees and the transmittance of the light incident at each of the aforementioned angles is divided by the transmittance of the light incident at 0 degrees respectively to obtain the transmittance deviation at each of the aforementioned angles.

As shown in FIG. 4A, since the viewing angle requirement of the display device is usually 45 degrees, taking the light incident from the air is at 45 degrees as an example, it can be seen that the transmittance deviation is minimized when the first thickness t1 of the substrate 100 is 600 μm, indicating that the light is incident from the air at 45 degrees, and the effect of the black pattern layer 40 on the light transmittance of the display device 1 as a transparent display device is minimized when the first thickness t1 of the substrate 100 is 600 μm. Therefore, from the light incident from the air at 45 degrees and the refractive index of the substrate 100 of 1.56, the refractive angle θ of the light incident from the air into the substrate 100 can be obtained as 27 degrees, so the refractive angle θ of 27 degrees and the arrangement pitch p of the light emitting elements 20 of 300 μm are brought into the mathematical equation (1) to obtain the first thickness t1 of the substrate 100 of about 590 μm±10%, which is in accordance with the simulation results of FIG. 4A.

Figure 4B:
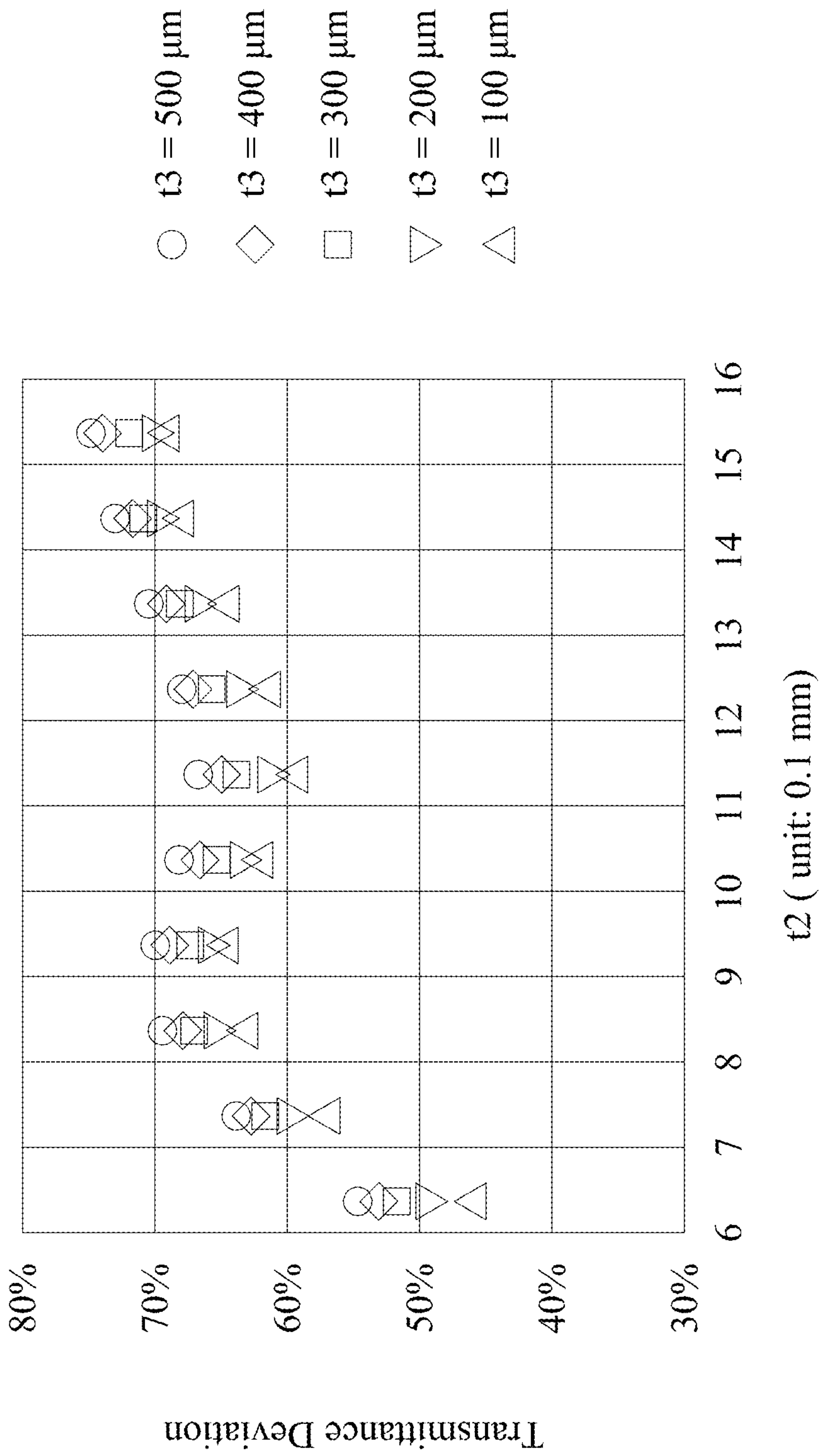
FIG. 4B is a simulated distribution diagram of transmittance deviation corresponding to different lower plate thicknesses corresponding to different total thicknesses of the cover plate and the substrate according to at least one embodiment of the present disclosure.

FIG. 4B is a simulated distribution diagram of transmittance deviation corresponding to different lower plate thicknesses corresponding to different total thicknesses of the cover plate and the substrate according to at least one embodiment of the present disclosure. First, to illustrate how to obtain the data of FIG. 4B, under the structure of FIG. 3B, light incident from the air is set at 0 degrees and 45 degrees with the normal line of the lower plate 30, and passes through the lower plate 30 having different first thicknesses t3 and the cover plate 50 and the substrate 100 having different second thicknesses t2. The transmittance of the light incident at 0 degrees and 45 degrees are measured above the cover plate 50 respectively, and the difference between the transmittance of the light incident at 0 degrees and the transmittance of the light incident at 45 degrees is divided by the transmittance of the light incident at 0 degrees to obtain the transmittance deviation at 45 degrees.

As shown in FIG. 4B, when the third thickness t3 of the lower plate 30 is 500 μm, 400 μm, 300 μm, 200 μm, and 100 μm respectively, the thinner the third thickness t3 of the lower plate 30 is, the smaller the transmittance deviation is, which means that the thinner the third thickness t3 of the lower plate 30 is, the smaller the effect of the black pattern layer 40 is on the light transmittance of the display device 1 as a transparent display device. When the second thickness t2 of the cover plate 50 and the substrate 100 is between 0.6 mm and 0.9 mm, the thinner the second total thickness t2 is, the smaller the transmittance deviation is. However, due to the first thickness of the substrate 100 need to be greater than a certain value to achieve a smaller transmittance deviation. When the second thickness t2 of the cover plate 50 and the substrate 100 is between 0.6 mm and 0.9 mm, the cover plate 50 may not be able to effectively protect the display device 1 due to its thin thickness. Therefore, when the second thickness t2 of the cover plate 50 and the substrate 100 is between 0.9 mm and 14 mm, the transmittance deviation is small; furthermore, given the requirement that the first thickness t1 of the substrate 100 must exceed a certain value, the thickness of the cover plate 50 will not be excessively thin.

Figure 5A:
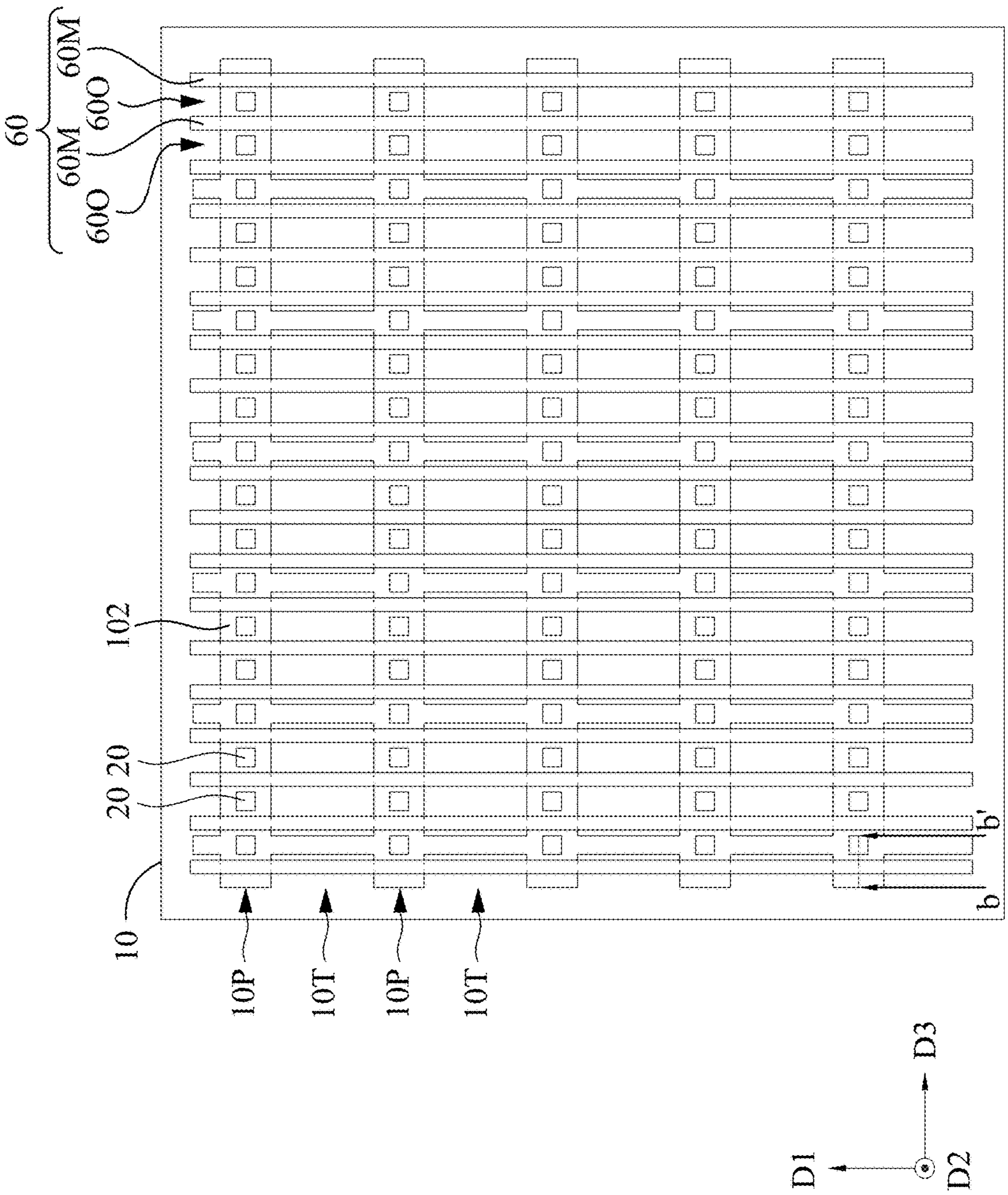
FIG. 5A is a schematic top view of a display device according to at least one embodiment of the present disclosure.

FIG. 5A is a schematic top view of a display device according to at least one embodiment of the present disclosure. For illustrative purposes, FIG. 5A merely shows the pixel array substrate 10, the light emitting elements 20, and the transparent medium pattern layer 60. Referring to FIG. 5A, the transparent medium pattern layer 60 has medium parts 60M extending in the first direction D1 and second opening areas 60O extending in the first direction D1. The medium parts 60M and the second opening areas 60O are arranged alternately in the third direction D3. In the second direction D2, the second opening areas 60O overlap with the light emitting elements 20.

Figure 5B:
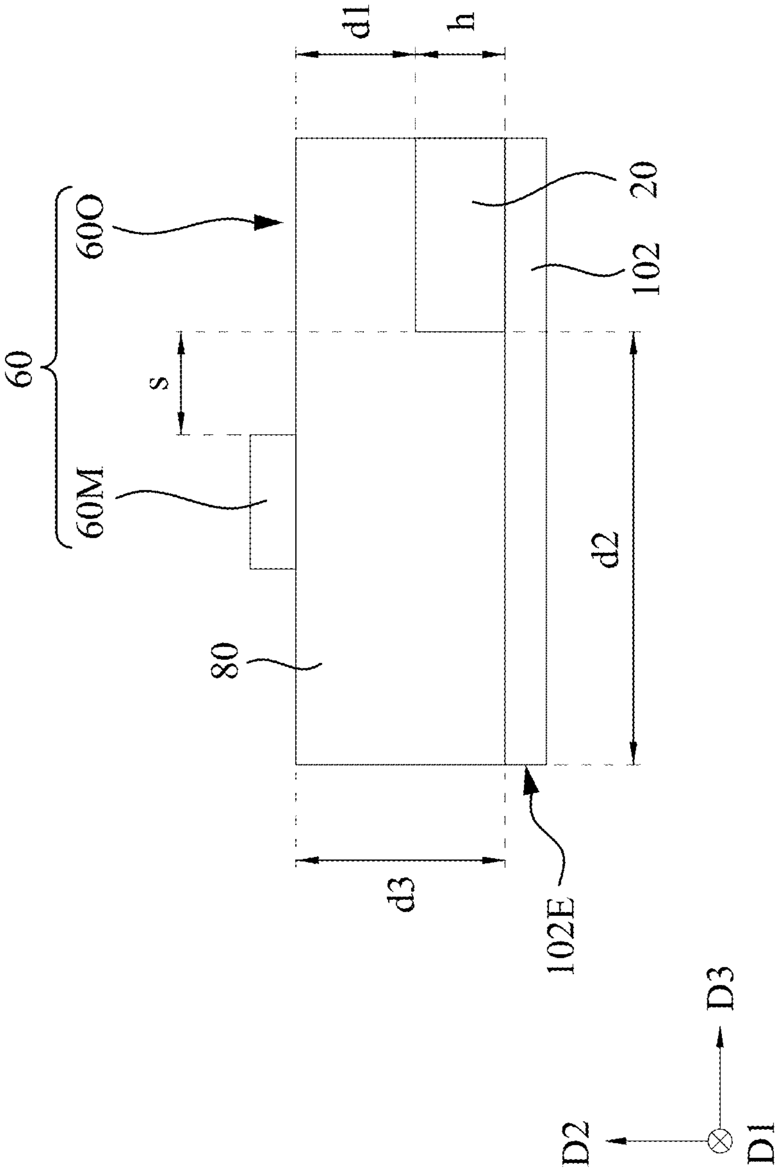
FIG. 5B is a schematic cross-sectional view taken along line b-b' of FIG. 5A.

FIG. 5B is a schematic cross-sectional view taken along line b-b' of FIG. 5A. For illustrative purposes, FIG. 5B merely shows the driving circuit layer 102, the light emitting elements 20, and the transparent medium pattern layer 60. Referring to FIG. 5B, in the second direction D2, there is a first distance d1 between the light emitting elements 20 and the transparent medium pattern layer 60, i.e., there is a first distance d1 between the light emitting elements 20 and the medium parts 60M of the transparent medium pattern layer 60. In some embodiments, the first distance d1 is less than 100 μm.

As shown in FIG. 5B, the light emitting elements 20, the second connection layer 80 and the transparent medium pattern layer 60 are sequentially disposed on the driving circuit layer 102 in the second direction D2. A first refractive index n1 of the second connection layer 80, a first distance d1 between the light emitting element 20 and the transparent medium pattern layer 60 along the second direction D2, and a spacing s between the light emitting elements 20 and the transparent medium pattern layer 60 in the third direction D3 satisfy the following mathematical equation (2), the light emitted by the light emitting elements 20 can have an exit angle of at least 45 degrees at the air interface after passing through the transparent medium pattern layer 60 to meet the general viewing angle requirements. In addition, the following mathematical equation (2) can be derived from geometric optics, Snell's Law, and geometric mathematics.

$$0 \le s \le d1 \times \tan\left(\sin^{-1}\left(\frac{1}{n1 \times \sqrt{2}}\right)\right) \tag{2}$$

Referring to FIG. 5B, the driving circuit layer 102 has an edge 102E in the first direction D1, and one of the light emitting elements 20 is adjacent to the edge 102E. A first refractive index n1 of the second connection layer 80, a height h of the light emitting element 20, a second distance d2 between the light emitting element 20 adjacent to the edge 102E and the edge 102E in the third direction D3, a third distance d3 between the driving circuit layer 102 and the transparent medium pattern layer 60 in the second direction D2, and a second refractive index n2 of the transparent medium pattern layer 60 satisfy the following mathematical equation (3), the light emitted by the light emitting elements 20 after being_total reflected by the transparent medium pattern layer 60 can be blocked by the driving circuit layer 102 to reduce light leakage from the back side of the display device 1. In addition, the following mathematical equation (3) can be derived from geometric optics, Snell's Law, and geometric mathematics.

$$d2 > (2 \times d3 - h) \times \tan\left(\sin^{-1}\left(\frac{n2}{n1}\right)\right) \tag{3}$$

Figure 6A:
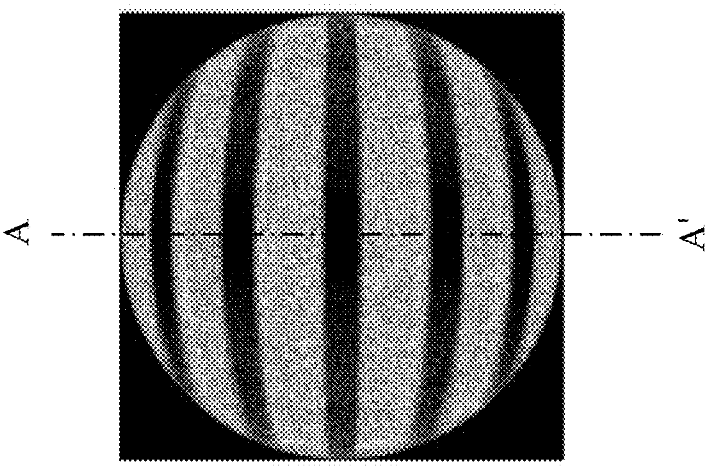
FIG. 6A to FIG. 6C are back side light leakage simulation diagrams of display devices of comparative examples and embodiments of the present disclosure.
Figure 6B:
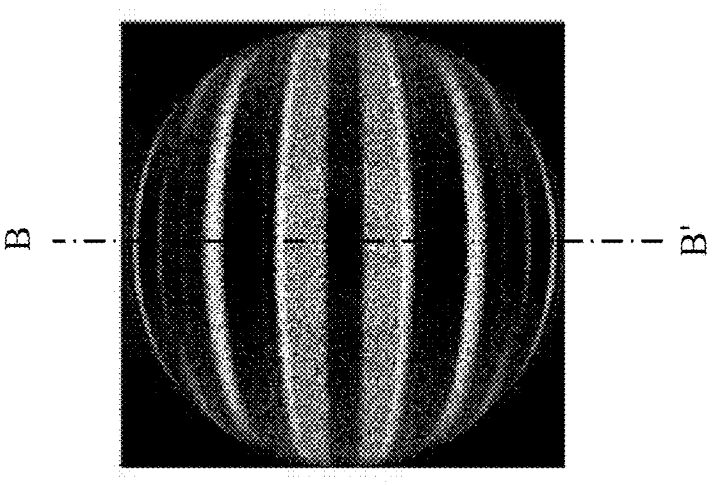
Figure 6C:
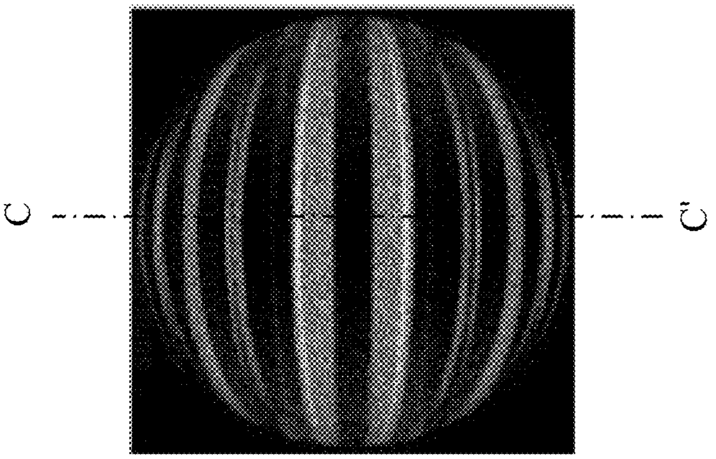

FIG. 6A to FIG. 6C are back light leakage simulation diagrams of display devices of comparative examples and embodiments of the present disclosure. The comparative example of FIG. 6A and the embodiments of FIGS. 6B and 6C all include the pixel array substrate 10 and the light emitting elements 20 as shown in FIGS. 2A and 2B. However, the display device of FIG. 6A is not provided with the black pattern layer 40 and the transparent medium pattern layer 60, and the display device of FIG. 6B includes the black pattern layer 40 as shown in FIG. 3A but is not provided with the transparent medium pattern layer 60. the display device of FIG. 6C includes the black pattern layer 40 as shown in FIG. 3A and the transparent medium pattern layer 60 as shown in FIG. 5A. Referring to FIGS. 6A to 6C, a darker gray scale indicates a smaller luminous flux for light leakage from the back side of the corresponding position of the display device, while a lighter gray scale indicates a larger luminous flux for light leakage from the back side of the corresponding position of the display device.

As shown in FIG. 6A, the darker gray scale (i.e., the black portion) corresponds to the back side light leakage of the pixel regions 10P, and since the pixel regions 10P are blocked by the driving circuit layer 102, there is almost no back side light leakage. The lighter gray scale (i.e., the white portion) corresponds to the back side light leakage of the light transmitting regions 10T. Since the comparative display device is not provided with the black pattern layer 40 and the transparent medium pattern layer 60, the back side light leakage is quite obvious. The total luminous flux of the back side light leakage is 1.015 W, and the total luminous flux of the front display light output is 11.13 W.

As shown in FIG. 6B, the positions corresponding to the light transmitting regions 10T have a darker gray scale compared to the same positions in FIG. 6A, and even some of the positions corresponding to the light transmitting regions 10T have a smaller width compared to the width of the same positions in FIG. 6A. Therefore, compared to the comparative example without the black pattern layer 40 and the transparent medium pattern layer 60, the embodiment with the black pattern layer 40 reduces the back side light leakage, and the total luminous flux of the back side light leakage of the embodiment is reduced to 0.57 W, which is only about 56% of the total luminous flux of the back side light leakage of the comparative example, and the total luminous flux of the front display light output of the embodiment is 11.13 W, which is the same as that of the comparative example, which means that the embodiment with the black pattern layer 40 does not affect the front display light output.

As shown in FIG. 6C, the positions corresponding to the light transmitting regions 10T have a darker gray scale compared to the same positions in FIG. 6B, and even some of the positions corresponding to the light transmitting regions 10T have a smaller width compared to the width of the same positions in FIG. 6B. Therefore, compared to the embodiment with only the black pattern layer 40, the embodiment with the black pattern layer 40 and the transparent medium pattern layer 60 can further reduce the back side light leakage, and the total luminous flux of the back side light leakage is reduced to 0.40 W. Although the total luminous flux of the front display light output of the embodiment is reduced to 9.68 W, which is about 87% of the total luminous flux of the front display light output in the comparative example, the total luminous flux of the back side light leakage is about 39% of the total luminous flux of the back side light leakage of the comparative example. Therefore, the benefit of the embodiment in reducing the back side light leakage is greater than its impact on the front display light output.

Figure 7A:
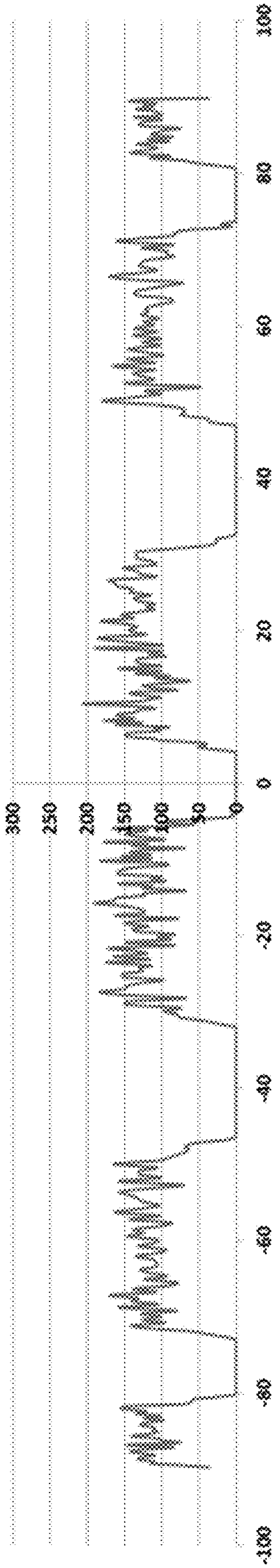
FIG. 7A to FIG. 7C are back side light leakage curves of display devices of comparative examples and embodiments of the present disclosure.
Figure 7B:
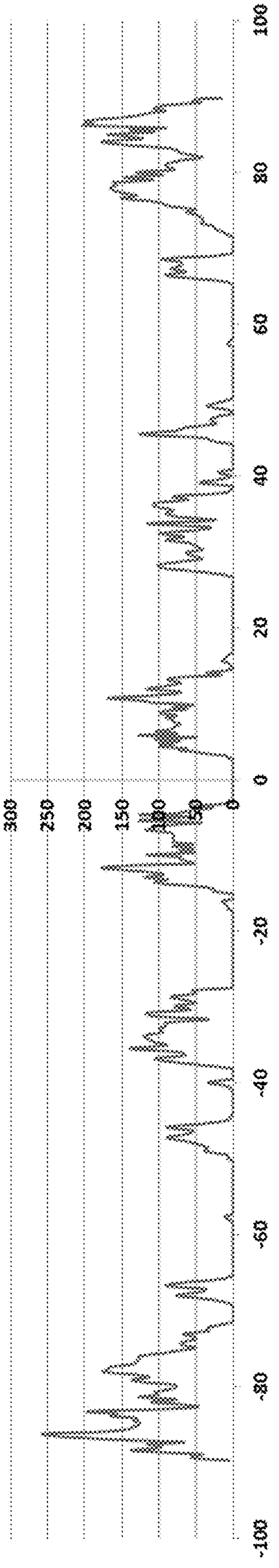
Figure 7C:
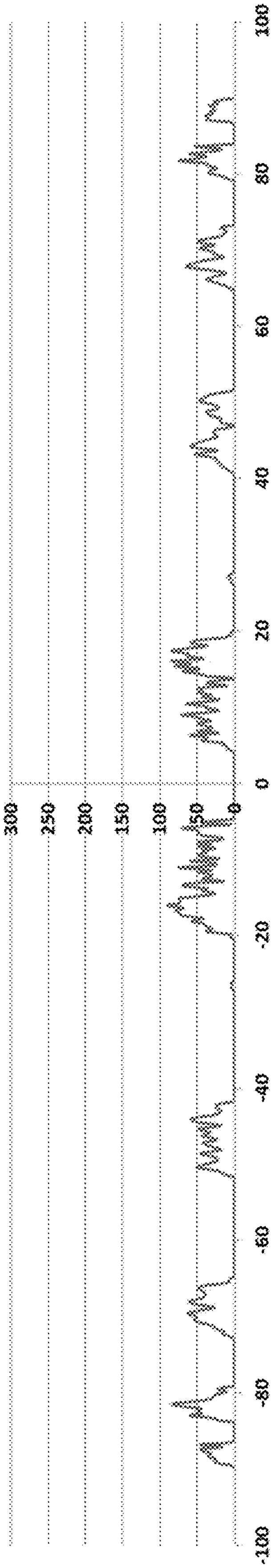

FIG. 7A to FIG. 7C are back light leakage curves of display devices of comparative examples and embodiments of the present disclosure. FIG. 7A to FIG. 7C are the back side light leakage curves obtained by corresponding to the lines A-A', B-B' and C-C' of FIG. 6A to FIG. 60, respectively, with the horizontal axis being the polar angle and the unit is angle (degree), and the vertical axis being the luminous flux and the unit is lumen (lm). However, the value of the vertical axis will change with the simulation setting of different parameters, such as the brightness of the light source, so FIG. 7A to FIG. 7C are merely used to illustrate the trend of observing the back side light leakage reduction phenomenon, that is, the present disclosure is not limited by the numerical value of the vertical axis.

Referring to FIGS. 7A and 7B, taking a viewing angle is about 45 degrees to 65 degrees as an example, the back side light leakage in FIG. 7B in the aforementioned region is significantly reduced compared to the back side light leakage in FIG. 7A in the aforementioned region, which indicates that the black pattern layer 40 reduces the back side light leakage in the viewing angle of 45 degrees to 65 degrees. Referring to FIGS. 7B and 7C, also taking the viewing angle is about 45 degrees to 65 degrees as an example, the back side light leakage in the aforementioned region of FIG. 7C has been further reduced as compared to the back side light leakage in the aforementioned region of FIG. 7B, indicating that disposing the black pattern layer 40 and the transparent medium pattern layer 60 can further reduce the back side light leakage in the viewing angle of 45 degrees to 65 degrees.

Table I below shows the data of simulating front display light output and back side light leakage with the structure of FIG. 1 at different thicknesses of each layer, but without the black pattern layer 40 and the transparent medium pattern layer 60, the thicknesses are in μm, and the luminous fluxes are in W:

TABLE I

| | Comparative examples | | | | |
|---|---|---|---|---|---|
| | A | B | C | D | E |
| Total thickness | 900 | 1000 | 1100 | 1400 | 1800 |
| Total thickness of layers on the light emitting elements | 400 | 500 | 600 | 900 | 1300 |
| Total thickness of layers under the light emitting elements | 500 | 500 | 500 | 500 | 500 |
| Thickness of cover plate | 300 | 400 | 500 | 800 | 1000 |
| Thickness of first connection layer | 0 | 0 | 0 | 0 | 0 |
| Transparent medium pattern layer | No | No | No | No | No |
| Thickness of second connection layer | 100 | 100 | 100 | 100 | 100 |
| Thickness of substrate | 500 | 500 | 500 | 500 | 500 |
| Thickness of black pattern layer | 0 | 0 | 0 | 0 | 0 |
| Thickness of lower plate | 0 | 0 | 0 | 0 | 0 |
| total luminous flux of the front display light output | 11.17 | 11.13 | 11.13 | 11.07 | 11 |
| total luminous flux of the back side light leakage | 0.964 | 1.023 | 1.012 | 1.0916 | 1.21 |
| Total luminous flux ratio of the front display light output to the back side light leakage | 11.59 | 10.88 | 11.00 | 10.14 | 9.09 |

As can be seen from Table I, the difference between comparative examples A to E is the thickness of the cover plate 50, and the thicker the thickness of the cover plate 50, the greater the luminous flux of the back side light leakage, i.e., the more serious the back side light leakage is. However, if the thickness of the cover plate 50 is 300 μm, the cover plate 50 may be insufficiently protected or have alignment issue. Therefore, the suitable thickness of the cover plate 50 is 400 to 500 μm (including the end value).

Table II below shows the data of simulating front display light output and back side light leakage with the structure of FIG. 1 at different thicknesses of each layer and with the black pattern layer 40 but without the transparent medium pattern layer 60, with the thicknesses in μm and the luminous flux in W:

TABLE II

| Embodiments | A | B | C | D | E |
|---|---|---|---|---|---|
| Total thickness | 1100 | 1200 | 1300 | 1000 | 1400 |
| Total thickness of layers on the light emitting elements | 600 | 600 | 600 | 500 | 500 |
| Total thickness of layers under the light emitting elements | 500 | 600 | 700 | 500 | 900 |
| Thickness of cover plate | 500 | 500 | 500 | 400 | 400 |
| Thickness of first connection layer | 0 | 0 | 0 | 0 | 0 |
| Transparent medium pattern layer | No | No | No | No | No |
| Thickness of second connection layer | 100 | 100 | 100 | 100 | 100 |
| Thickness of substrate | 200 | 300 | 400 | 200 | 400 |
| Thickness of black pattern layer | 100 | 100 | 100 | 100 | 100 |
| Thickness of lower plate | 200 | 200 | 200 | 200 | 400 |
| total luminous flux of the front display light output | 11.13 | 11.13 | 11.13 | 11.13 | 11.13 |
| total luminous flux of | 0.578 | 0.59 | 0.602 | 0.58 | 0.618 |

TABLE II-continued

| Embodiments | A | B | C | D | E |
|---|---|---|---|---|---|
| the back side light leakage | | | | | |
| Total luminous flux ratio of the front display light output to the back side light leakage | 19.26 | 18.86 | 18.49 | 19.19 | 18.0 |

As can be seen from Table II, the total luminous flux ratio of the front display light output to the back side light leakage in examples A to E are all close to 20, which is almost twice as high as the total luminous flux ratio of the front display light output to the back side light leakage in comparative examples A to E of about 10, indicating that the setting of the black pattern layer 40 effectively reduces the back side light leakage without affecting the front display light output as well. In addition, as can be seen in examples A to C, the thicker the thickness of the substrate 100, the more serious the back side light leakage, so the suitable thickness of the substrate 100 is not greater than 400 μm.

Table III below shows the data of simulating front display light output and back side light leakage with the structure of FIG. 1 at different thicknesses of each layer and with the black pattern layer 40 and the transparent medium pattern layer 60. Since the thickness of the transparent medium pattern layer 60 is much smaller than that of the other layers, it is not specifically listed, and the unit of thickness is μm, and the unit of luminous flux is W:

TABLE III

| Embodiments | F | G | H | I | J |
|---|---|---|---|---|---|
| Total thickness | 1000 | 1100 | 1200 | 1400 | 1000 |
| Total thickness of layers on the light emitting elements | 500 | 500 | 500 | 500 | 400 |
| Total thickness of layers under the light emitting elements | 500 | 600 | 700 | 900 | 600 |
| Thickness of cover plate | 400 | 400 | 400 | 400 | 400 |
| Thickness of first connection layer | 100 | 100 | 100 | 100 | 0 |
| Transparent medium pattern layer | Yes | Yes | Yes | Yes | Yes |
| Thickness of second connection layer | 0 | 0 | 0 | 0 | 100 |
| Thickness of substrate | 200 | 300 | 400 | 400 | 200 |
| Thickness of black pattern layer | 100 | 100 | 100 | 100 | 100 |
| Thickness of lower plate | 200 | 200 | 200 | 400 | 200 |
| total luminous flux of the front display light output | 10.71 | 10.71 | 10.71 | 10.71 | 4.14 |
| total luminous flux of the back side light leakage | 0.336 | 0.335 | 0.353 | 0.353 | 0.411 |
| Total luminous flux ratio of the front display light output to the back side light leakage | 31.88 | 31.97 | 30.3 | 30.3 | 10.07 |

As can be seen from Table III, the total luminous flux ratio of the front display light output to the back side light leakage in examples F to I are all close to 30, which is almost three times higher than the total luminous flux ratio of the front display light output to the back side light leakage in comparative examples A to E of about 10, indicating that disposing the black pattern layer 40 and the transparent medium pattern layer 60 further reduces the back side light leakage and does not substantially affect the front display light output. In addition, as can be seen from examples F to I and example J, if the second connecting layer 80 of 100 μm is provided between the transparent medium pattern layer 60 and the substrate 100, the front display light output will be greatly reduced and the display quality will be affected, so it is more suitable to have a distance of less than 100 μm between the transparent medium pattern layer 60 and the light emitting elements 20.

In summary, in at least one embodiment of the display device of the present disclosure, light leakage from the back side of the display device is reduced by disposing the black pattern layer between the pixel array substrate and the lower plate. In addition, by disposing the transparent medium pattern layer with the refractive index greater than that of the cover plate between the cover plate and the light emitting elements, light leakage from the back side of the display device due to total reflection caused by the cover plate can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A display device, comprising:

a pixel array substrate, having a display surface and a bottom surface opposite to the display surface, wherein the display surface has a plurality of pixel regions and a plurality of light transmitting regions, and the pixel regions are arranged alternately with the light transmitting regions in a first direction;

a plurality of light emitting elements, disposed on the display surface and electrically connected to the pixel array substrate, wherein the light emitting elements are located in the pixel regions;

a lower plate, wherein the bottom surface is located between the display surface and the lower plate; and a black pattern layer, disposed between the pixel array substrate and the lower plate in a second direction perpendicular to the first direction, and having a plurality of light shielding parts and a plurality of first opening areas, wherein the light shielding parts are arranged alternately with the first opening areas in the first direction, the light shielding parts overlap with the pixel regions, and the first opening areas overlap with the light transmitting regions in the second direction.

2. The display device of claim 1, further comprising:

a cover plate, disposed on the light emitting elements, and a transparent medium pattern layer, disposed between the cover plate and the light emitting elements, wherein a refractive index of the transparent medium pattern layer greater than a refractive index of the cover plate.

3. The display device of claim 2, wherein the transparent medium pattern layer has a plurality of medium parts and a plurality of second opening areas, wherein the medium parts are arranged alternately with the second opening areas in a third direction perpendicular to the second direction, the third direction is different from the first direction, and the second opening areas overlap with the light emitting elements in the second direction.

4. The display device of claim 3, further comprising a connection layer disposed in the second opening areas.

5. The display device of claim 4, wherein a refractive index of the connection layer is the refractive index of the cover plate ±5%.

6. The display device of claim 4, wherein the connection layer comprises a first connection layer disposed between the transparent medium pattern layer and the cover plate.

7. The display device of claim 4, wherein the connection layer comprises a second connection layer disposed between the light emitting elements and the transparent medium pattern layer, the second connection layer has a first refractive index, a first distance is formed between one of the light emitting elements and the transparent medium pattern layer in the second direction, and a spacing is formed between the one of the light emitting elements and the transparent medium pattern layer in the third direction, wherein the first refractive index, the first distance and the spacing satisfy the following mathematical equation:

$$0 \leq s \leq d1 \times \tan\left(\sin^{-1}\left(\frac{1}{n1 \times \sqrt{2}}\right)\right),$$

wherein n1 is the first refractive index, d1 is the first distance, and s is the spacing.

8. The display device of claim 4, wherein the connection layer comprises a second connection layer disposed between the light emitting elements and the transparent medium pattern layer, the pixel array substrate comprises a substrate and a driving circuit layer disposed on the substrate, the driving circuit layer has an edge in the first direction, and one of the light emitting elements is adjacent to the edge, the second connection layer has a first refractive index, the one of the light emitting elements has a height, a second distance is formed between the one of the light emitting elements and the edge, a third distance is formed between the driving circuit layer and the transparent medium pattern layer, and the transparent medium pattern layer has a second refractive index, wherein the first refractive index, the height, the second distance, the third distance and the second refractive index satisfy the following mathematical equation:

$$d2 > (2 \times d3 - h) \times \tan\left(\sin^{-1}\left(\frac{n2}{n1}\right)\right),$$

wherein n1 is the first refractive index, h is the height, d2 is the second distance, d3 is the third distance, and n2 is the second refractive index.

9. The display device of claim 2, wherein a first distance is formed between one of the light emitting elements and the transparent medium pattern layer in the second direction, and the first distance is less than 100 μm.

10. The display device of claim 2, wherein a thickness of the cover plate is in a range from 400 μm to 500 μm.

11. The display device of claim 1, wherein the pixel array substrate comprises a substrate, the substrate has a thickness, light entering the substrate from air has a refraction angle, and an arrangement pitch is formed between the light emitting elements, wherein the thickness, the refraction angle and the arrangement pitch satisfy the following mathematical equation:

$$t1 \geq \frac{p}{\tan\theta} \pm 10\%,$$

wherein t1 is the thickness, θ is the refraction angle, and p is the arrangement pitch.

12. The display device of claim 11, wherein a refractive index of the substrate is in a range from 1.4 to 1.7.

13. The display device of claim 11, wherein the thickness of the substrate is not greater than 400 μm.

14. A display device, comprising:

a pixel array substrate, having a display surface and a bottom surface opposite to the display surface, wherein the display surface has a plurality of pixel regions and a plurality of light transmitting regions, and the pixel regions are arranged alternately with the light transmitting regions in a first direction;

a plurality of light emitting elements, disposed on the display surface and electrically connected to the pixel array substrate, wherein the light emitting elements are located in the pixel regions;

a lower plate, wherein the bottom surface is located between the display surface and the lower plate;

a black pattern layer, disposed between the pixel array substrate and the lower plate in a second direction perpendicular to the first direction, and having a plurality of light shielding parts and a plurality of first opening areas, wherein the light shielding parts are arranged alternately with the first opening areas in the first direction;

a cover plate, disposed on the light emitting elements; and a transparent medium pattern layer, disposed between the cover plate and the light emitting elements, wherein the transparent medium pattern layer has a plurality of medium parts and a plurality of second opening areas, the medium parts are arranged alternately with the second opening areas in a third direction perpendicular to the second direction, and third direction is different from the first direction.

15. The display device of claim 14, wherein in the second direction, the light shielding parts overlap with the pixel regions, the first opening areas overlap with the light transmitting regions, and the second opening areas overlap with the light emitting elements.

* * * * *